(12) United States Patent
Nakatsuru et al.

(10) Patent No.: US 7,919,397 B2
(45) Date of Patent: Apr. 5, 2011

(54) METHOD FOR REDUCING AGGLOMERATION OF SI LAYER, METHOD FOR MANUFACTURING SEMICONDUCTOR DEVICE AND VACUUM TREATMENT APPARATUS

(75) Inventors: Junko Nakatsuru, Fuchu (JP); Hiroki Date, Tachikawa (JP)

(73) Assignee: Canon Anelva Corporation, Kawasaki-shi (JP)

(*) Notice: Subject to any disclaimer, the term of this patent is extended or adjusted under 35 U.S.C. 154(b) by 0 days.

(21) Appl. No.: 12/683,183

(22) Filed: Jan. 6, 2010

(65) Prior Publication Data
US 2010/0144127 A1    Jun. 10, 2010

Related U.S. Application Data

(63) Continuation of application No. PCT/JP2008/062569, filed on Jul. 11, 2008.

(30) Foreign Application Priority Data

Jul. 13, 2007    (JP) ................................ 2007-184043

(51) Int. Cl.
*H01L 21/20* (2006.01)
*H01L 21/36* (2006.01)

(52) U.S. Cl. .................................. 438/481; 257/E21.09

(58) Field of Classification Search .................. 438/481; 257/E21.09
See application file for complete search history.

(56) References Cited

U.S. PATENT DOCUMENTS

| 5,551,982 A | 9/1996 | Anderson et al. | 118/715 |
| 5,599,397 A | 2/1997 | Anderson et al. | 118/728 |
| 5,725,673 A | 3/1998 | Anderson et al. | 118/715 |

(Continued)

FOREIGN PATENT DOCUMENTS

JP    08-055842    2/1996

(Continued)

OTHER PUBLICATIONS

Jahan, C. et al., "Agglomeration Control During the Selective Epitaxial Growth of Si Raised Sources and Drains on Ultra-thin Silicon-on-Insulator Substrates", Journal of Crystal Growth, vol. 280, No. 3-4, pp. 530-538 (2005).

*Primary Examiner* — Matthew C Landau
*Assistant Examiner* — Sonya D McCall Shepard
(74) *Attorney, Agent, or Firm* — Fitzpatrick, Cella, Harper & Scinto

(57) ABSTRACT

The present invention provides a method for reducing the agglomeration of a Si layer in an SOI substrate, which can prevent the agglomeration of the Si layer from occurring in a heating and temperature-raising process for the Si layer, when heating and temperature-raising the Si layer that is the outermost surface of the SOI substrate and is in an exposed state, and can prevent the agglomeration further without forming a protective film on the SOI substrate. The method for reducing the agglomeration of the Si layer in the SOI substrate is a method of supplying a hydride gas in a heating and temperature-raising process for the Si layer, when heating and temperature-raising the Si layer which is in an exposed state in the SOI substrate that has an insulation layer and the Si layer sequentially stacked on a Si substrate. In this method, the hydride gas dissociates before the Si layer coheres, at a temperature at which the Si layer does not yet start agglomeration, and terminates a dangling bond of the Si layer with a predetermined atom such as H.

9 Claims, 3 Drawing Sheets

U.S. PATENT DOCUMENTS

| | | | |
|---|---|---|---|
| 5,834,059 A | 11/1998 | Anderson et al. | 427/255 |
| 6,297,172 B1 * | 10/2001 | Kashiwagi | 438/773 |
| 6,391,692 B1 | 5/2002 | Nakamura | 438/151 |
| 6,861,322 B2 | 3/2005 | Hirashita et al. | 438/308 |
| 2002/0119627 A1 | 8/2002 | Nakamura | 438/294 |
| 2002/0182784 A1 | 12/2002 | Hirashita et al. | 438/149 |
| 2007/0072398 A1 | 3/2007 | Shibata et al. | 438/478 |

FOREIGN PATENT DOCUMENTS

| | | |
|---|---|---|
| JP | 08-100264 | 4/1996 |
| JP | 10-041321 | 2/1998 |
| JP | 2001-244469 | 9/2001 |
| JP | 2002-353426 | 12/2002 |
| JP | 2007-096137 | 4/2007 |

* cited by examiner

US 7,919,397 B2

METHOD FOR REDUCING AGGLOMERATION OF SI LAYER, METHOD FOR MANUFACTURING SEMICONDUCTOR DEVICE AND VACUUM TREATMENT APPARATUS

CROSS-REFERENCES TO RELATED APPLICATIONS

This application is a continuation application of International Application No. PCT/JP2008/062569, filed on Jul. 11, 2008, the entire contents of which are incorporated by reference herein.

TECHNICAL FIELD

The present invention relates to a method for reducing the agglomeration of a Si layer, and particularly relates to a method for reducing the agglomeration of the Si layer, which prevents generation of agglomeration in the outermost Si layer of an SOI substrate when heating and temperature-raising the SOI substrate.

BACKGROUND ART

In recent years, a semiconductor element such as a field-effect transistor is formed on an SOI (Silicon On Insulator) substrate (Patent document 1). The SOI substrate is generally constituted by a stacked structure comprising a Si (silicon) substrate, an insulation layer ($SiO_2$ layer) deposited on the Si substrate, and a crystalline Si layer further deposited on the insulation layer.

Such an SOI substrate can realize both of the high speed processing capability and low power consumption of LSI (Large Scale Integrated Circuit) and the like, and has drawn attention as a next semiconductor substrate. In the SOI substrate, a Si layer has been currently thinned (15 nm or less) progressively so as to decrease the parasitic capacitance of a MOS transistor or the like.

In recent years, the following problem on the SOI substrate has been raised which has occurred along with the tendency of thinning the Si layer.

When the outermost Si layer of the SOI substrate is approximately 10 nm thick and is heated and temperature-raised according to some circumstances, the Si layer causes a phenomenon of agglomeration on a certain temperature condition. An example of such a heating and temperature-raising process is the case of growing a Si epitaxial film on the outermost Si layer of the SOI substrate through the heating and temperature-raising process. In this case, a cohering action occurs in the above described Si layer, which causes a problem that the Si epitaxial film is hardly grown on the Si layer.

In addition, another example is the case of forming a film on the Si layer by using a CVD film-forming process. In this case, it is known that when the film-forming step includes a process of raising the temperature to approximately 600° C. by heating, agglomeration occurs in the Si layer in a stage of the heating and temperature-raising process.

The reason why the agglomeration occurs in the Si layer as was described above is assumed to be because when the Si layer becomes as thin as approximately 10 nm, the thickness of the Si layer corresponds to that of several atomic layers and then it becomes difficult to keep the state of the film layer stable. However, the exact reason why the agglomeration occurs in the Si layer is not sufficiently elucidated in the present stage.

Then, Patent document 1 is directed to the problem of the above described agglomeration of the Si layer. In the method for manufacturing the semiconductor device according to Patent document 1, two methods are proposed in order to prevent the agglomeration of the Si layer.

The first method is a method of controlling the heat treatment temperature to a temperature lower than the agglomeration temperature of the Si layer, when the surface of the Si layer is exposed in heat-treating a substrate having the Si layer formed thereon in a non-oxidizing atmosphere. (Patent document 1, paragraph [0009] and the like). However, there is a case in which the substrate needs to be temperature-raised to the agglomeration temperature or higher. In this case, the temperature is raised by covering the surface of the Si layer with a protective film, which is referred to as a second method. In the second method, a protective film of $SiO_2$, $Si_3N_4$ or the like is formed on the surface of the Si layer, before the Si layer is heat-treated at the agglomeration temperature or higher. (Patent document 1, paragraph [0010] or the like).

By the way, when the Si epitaxial layer is grown on the outermost Si layer of the SOI substrate, for instance, as was described above, the Si epitaxial layer needs to be temperature-raised to the agglomeration temperature of the Si layer or higher, and the surface of the Si layer needs to be exposed. In such a case, the method described in Patent document 1 cannot solve the problem of the above described agglomeration.

Patent documents 1: Japanese Patent Application Laid-Open No. 2002-353426

DISCLOSURE OF THE INVENTION

As described above, when the Si epitaxial film is formed on the outermost Si layer of the SOI substrate, for instance, the outermost Si layer is necessarily in an exposed state and needs to be heated and temperature-raised to the agglomeration temperature of the Si layer or higher, which results in causing the problem of the above described agglomeration of the Si layer. For this reason, the problem to be solved by the present invention is to prevent the agglomeration phenomenon of the Si layer by preparing a condition in which the cause of the agglomeration of the Si layer is not produced in the heating and temperature-raising process, even in such a case.

Furthermore, the above described patent document 1 describes the other problems that: (1) the epitaxial film cannot be formed on the protective film formed for reducing the agglomeration (because the epitaxial film is essentially formed on polished SOI substrate); and (2) an extra step of removing the above described protective film is needed even when other processes other than a process for the epitaxial film are carried out.

With respect to the above described problems, an object of the present invention is to provide a method for reducing the agglomeration of a Si layer, which can prevent generation of the agglomeration in the outermost Si layer in an exposed state of the SOI substrate when heating and temperature-raising the Si layer to the temperature of causing the agglomeration or higher, and can prevent the agglomeration further without forming the protective film on the SOI substrate.

In order to achieve the above described object, the method for reducing the agglomeration of a Si layer according to the present invention is configured in the following way.

The reducing method in one embodiment of the present invention includes: introducing a necessary hydride gas into a film-forming chamber at an optimal stage before the agglomeration of the Si layer occurs; dissociating the hydride gas to create a condition in which the Si layer does not cohere due to the dissociated hydride gas; and thereby preventing the Si layer from cohering.

In the above described method for preventing the agglomeration of the Si layer, the hydride gas dissociates in a stage before the Si layer coheres in a heating and temperature-raising process, the hydrogen atoms are bonded to a large amount of dangling bonds of the Si layer, and the dangling bonds are terminated. Thereby, the agglomeration of the Si layer can be prevented.

This method can prevent the hydride gas from forming the film on the Si layer in a temperature-raising period, by an etching action of a halogen-atom-containing gas even when the hydride gas is introduced in the temperature-raising period.

A film-forming method according to the present invention is a method for forming a film on a single-crystal Si layer by depositing a film-forming material on the layer from a gas of the film-forming material at a predetermined growth temperature, and comprises:

preparing a substrate having the single-crystal Si layer which is kept at a 1st temperature lower than the predetermined growth temperature, in the inside of a film-forming chamber;

introducing the gas of the film-forming material and a halogen gas into the film-forming chamber, before the temperature of the single-crystal Si layer reaches the predetermined growth temperature, when raising the temperature of the single-crystal Si layer on the substrate to the predetermined growth temperature from the 1st temperature;

and depositing the film-forming material in the gas of the film-forming material on the single-crystal Si layer at the predetermined growth temperature, by reducing a content ratio of the halogen atom gas to the gas of the film-forming material in the inside of the film-forming chamber, after the temperature of the single-crystal Si layer has reached the predetermined growth temperature.

In the embodiments according to the present invention, the single-crystal Si layer has the thickness of approximately 10 nm or less; the first temperature is lower than 400° C.; the film-forming material gas decomposes at the predetermined growth temperature or lower, and is a hydride compound of Si or Ge, for instance, $Si_2H_6$; the halogen gas is chlorine gas; and the formed film is an epitaxial layer formed on an SOI substrate.

The method according to the present invention can prevent or reduce a Si layer from cohering in a heating and temperature-raising process.

15 and 16 Film-forming chamber
24 Heater
26 Radiation thermometer
27 Si substrate
31 SOI substrate
33 Si layer

BEST MODE FOR CARRYING OUT THE INVENTION

Preferred embodiments (examples) according to the present invention will now be described below with reference to attached drawings.

Figure 1:
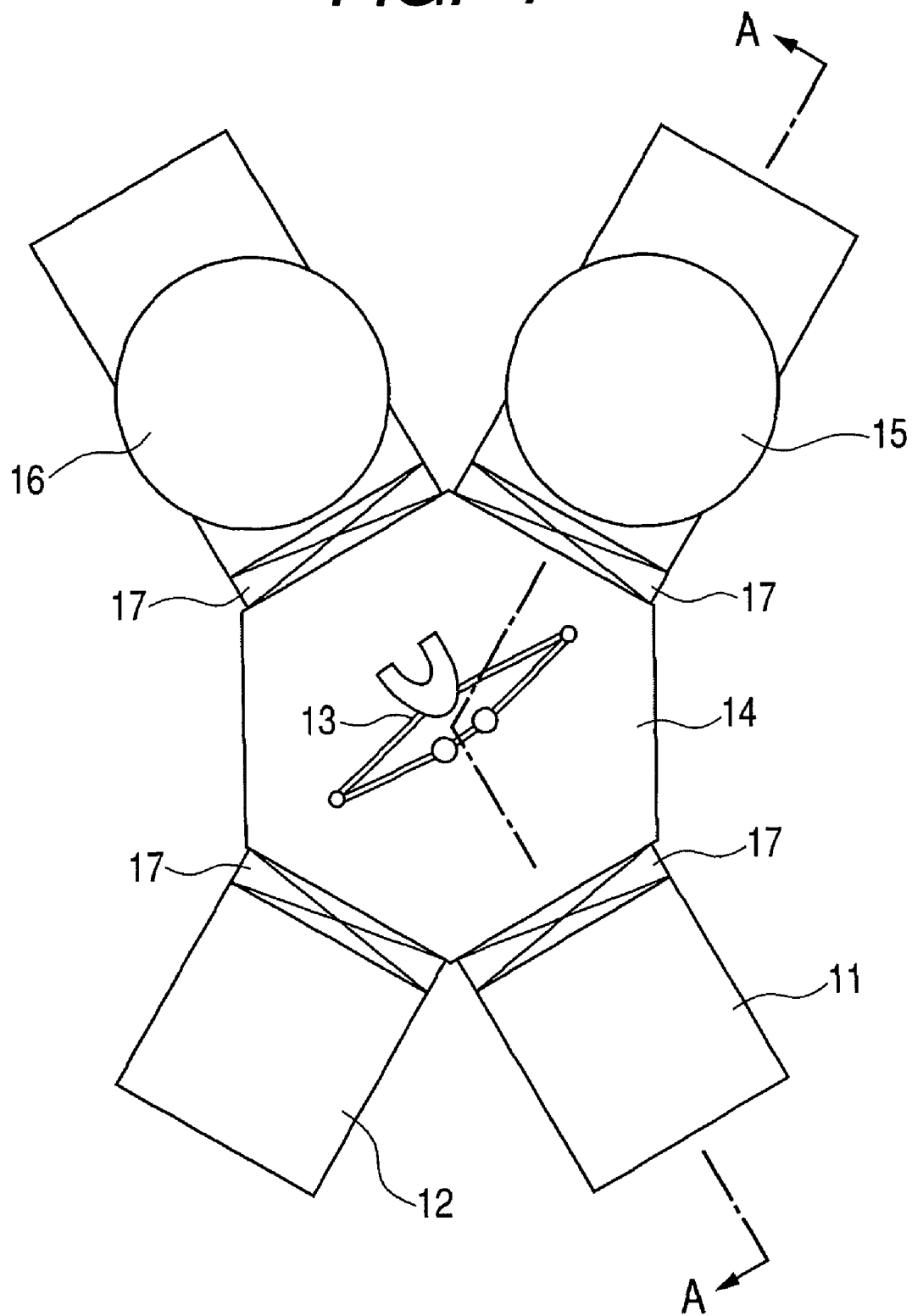
FIG. 1 is a plan view illustrating one example of a film-forming apparatus in which a method for preventing agglomeration of an SOI substrate according to the present invention is carried out.
Figure 2:
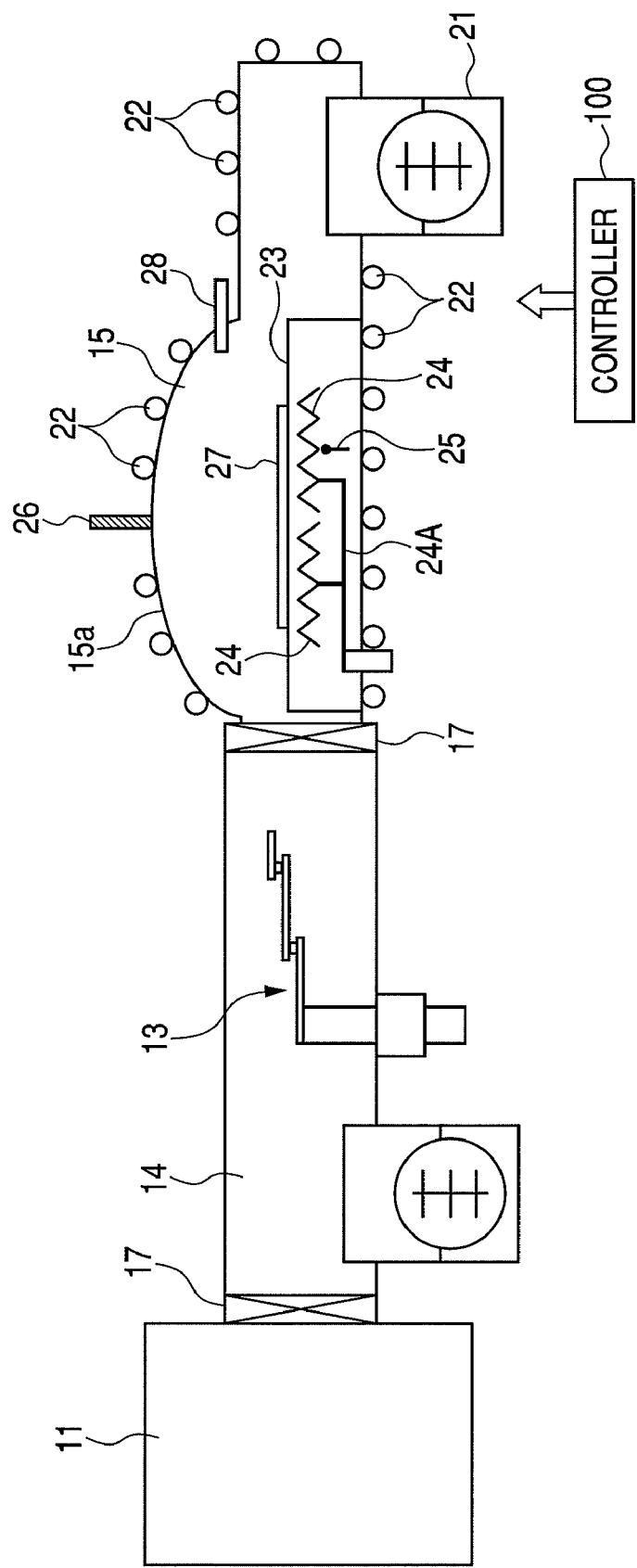
FIG. 2 is a sectional view taken along the line A-A of FIG. 1.

FIG. 1 and FIG. 2 illustrate a CVD apparatus in which a method for reducing the agglomeration of the SOI substrate according to the present invention is carried out, as one example of a film-forming apparatus. FIG. 1 is a plan view of a CVD apparatus, and FIG. 2 is a sectional view taken along the line A-A of FIG. 1. According to the present embodiment, as one example, the SOI substrate is transported into the inside of the film-forming chamber of the CVD apparatus, and the epitaxially growing film of Si (silicon) is formed on the outermost single-crystal Si layer in an exposed state of the SOI substrate. However, the Si layer to which the method according to the present invention is applied is not limited to the single-crystal Si layer or the crystalline Si layer, and the film-forming apparatus is not limited to the CVD apparatus.

In FIG. 1 and FIG. 2, this CVD apparatus includes: two exchange chambers 11 and 12 for charging and discharging the SOI substrate between an external atmospheric environment and the inside of the vacuum chamber; a transport chamber 14 having a transport mechanism 13 which transports the SOI substrate in a vacuum environment; and two film-forming chambers 15 and 16 which form the epitaxial film of Si therein. The exchange chambers 11 and can accommodate, for instance, plural plates of SOI substrates with a size of 8 inches. Gate valves 17 are provided in between the exchange chambers 11 and 12 and the transport chamber 14, and in between the transport chamber 14 and two film-forming chambers 15 and 16, respectively. Each vacuum chamber is exhausted by each independent turbo molecular pump.

In FIG. 2, the above described turbo molecular pump 21 is provided in the film-forming chamber 15, and a heater 22 for heating is provided on the outside of the wall portion of a ceiling portion 15a of the film-forming chamber 15 or the like. The heater 22 heats the film-forming chamber 15 which has been exposed to the atmosphere in a maintenance period or the like to desorb moisture adsorbed onto the wall of the vacuum vessel. The inside of the film-forming chamber 15 is exhausted, for instance, to an ultra-high vacuum of $5 \times 10^{-7}$ Pa. Two heaters 24 for heating a substrate are provided in the inside of a susceptor 23. An electric power for heating is supplied to each of the two heaters 24 by a power-feeding mechanism 24A. The temperature state of the susceptor 23 is detected by a thermocouple 25, and is controlled to a required temperature by the heater 24 of which the heating state is controlled. A radiation thermometer 26 is provided on the outside of the film-forming chamber 15 and measures the temperature of the SOI substrate 27 mounted on the susceptor 23.

The SOI substrate 27 is arranged on the susceptor 23 so that the surface on which a device is to be formed directs upward. The susceptor 23 has three holes therein each with the diameter of 7 mm, for instance, and pins made from quartz (not shown) move upward and downward through the holes to transport the SOI substrate 27 from the transport mechanism 13 to the susceptor 23 and mount the substrate on the susceptor. After the SOI substrate 27 has been mounted on the susceptor 23, the above described hole is blocked by the SOI substrate itself.

Furthermore, the film-forming chamber 15 has a raw-gas introduction part 28 provided therein so as to introduce a raw gas thereinto. In this embodiments, in order to grow a Si epitaxial film on the SOI substrate 27, a hydride gas and/or a halogen gas are introduced as a raw gas, as will be described later. The hydride gas is disilane gas ($Si_2H_6$), for instance, and the halogen gas is chlorine gas ($Cl_2$), for instance. In this embodiment, disilane gas ($Si_2H_6$) and chlorine gas ($Cl_2$) are introduced.

In addition, a controller 140 is provided in the film-forming apparatus, and controls actions of a power-feeding mechanism 24A which feeds an electric power to the heater 24, a gas introduction part 28, a heater 22, a turbo molecular pump 21 and the like. The controller is provided with a computer or the like, and realizes the actions by executing the program.

Next, an example will now be described in which a Si epitaxial film, for instance, is formed on an SOI substrate 27 in the above described film-forming chamber 15 of the CVD apparatus.

Figure 3:
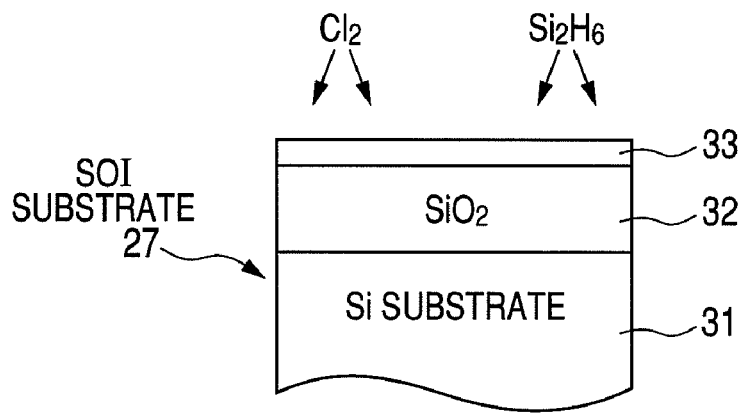
FIG. 3 is a sectional view illustrating a structure of an SOI substrate.

As is illustrated in FIG. 3, the SOI substrate 27 comprises a Si substrate 31, an $SiO_2$ film 32 which is an insulation film deposited on the Si substrate 31, and the outermost Si layer 33 deposited further thereon. The outermost Si layer 33 on the SOI substrate 27 is exposed.

The Si layer 33 positioned on the outermost surface of the SOI substrate 27 is cleaned with a mixture liquid of hydrochloric acid and hydrogen peroxide, an ammonia hydrogen peroxide solution or the like so as to remove a natural oxide film due to oxygen and/or moisture in the atmosphere or a metallic component and/or an organic component. For this reason, a silicon oxide film ($SiO_2$ film) with a thickness of approximately 1 mm is generally formed on the Si layer 33. This silicon oxide film is removed beforehand by an etching operation in a diluted aqueous solution of hydrofluoric acid. The surface of the Si layer 33 which has been treated in this diluted aqueous solution of hydrofluoric acid is terminated by hydrogen (H).

The above described SOI substrate 27 is mounted on the susceptor 23 of the film-forming chamber 15 via the exchange chamber 11 and the transport chamber 14, as was described above. The inside of the film-forming chamber 15 is exhausted, for instance, to an ultra-high vacuum of $5 \times 10^{-7}$ Pa. In the film-forming chamber 15, the SOI substrate mounted on the susceptor 23 is further heated and temperature-raised to approximately 400° C. by the heater 24, in order to grow the Si epitaxial film on the outermost Si layer in an exposed state. In the present embodiment, immediately after the above described operation, disilane gas ($Si_2H_6$) which is a hydride gas and chlorine gas ($Cl_2$) which is a halogen gas are introduced together from the raw-gas introduction part 28.

In the above described heating and temperature-raising process, typically starting from a stage where the temperature exceeds 400° C., the above described terminated hydrogen atom usually desorbs from the surface of the Si layer 33. When the heating and temperature-raising process is continued afterwards in such a state that the hydrogen atom has desorbed, the exposed outermost Si layer 33 of the SOI substrate 27 is heated in the ultra-high vacuum during an elapsing period of time before the temperature reaches 600° C. (time zone 51 of FIG. 5), and the thin-film Si layer 33 results in cohering.

Figure 4:
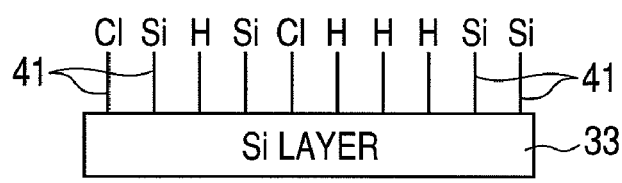
FIG. 4 is a view illustrating a terminated state of a dangling bond in a Si layer.
Figure 5:
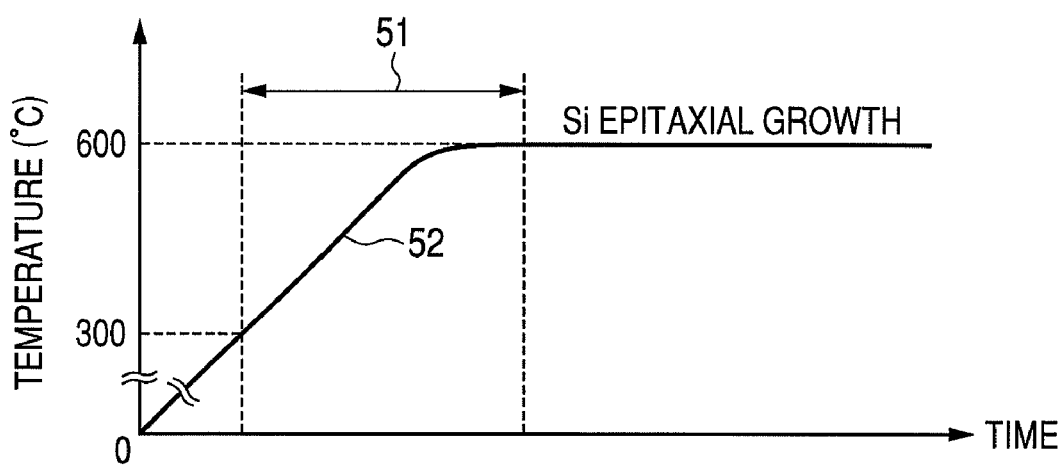
FIG. 5 is a graph showing a changing state of a temperature when a Si epitaxial layer is grown on the SOI substrate.

For this reason, in the present embodiment, when the temperature of the SOI substrate 27 has reached approximately 400° C. in the heating and temperature-raising process, in other words, in a stage before agglomeration of the Si layer 33 generates (in other words, in a stage before the temperature reaches 600° C.), chlorine gas is introduced together with disilane gas as was described above and as is illustrated in FIG. 3, and these gases are supplied toward the surface of the Si layer 33 to terminate the dangling bond of the surface of the exposed Si layer 33 with a predetermined atom. The terminated state is illustrated in FIG. 4. The heating and temperature-raising process is continued while such a terminated state is kept until the temperature reaches 600° C. to heat the Si layer 33 of the SOI substrate 27. Here, the graph 52 of FIG. 5 shows change characteristics of the temperature.

Based on the above described treatment and operation, the dangling bond on the surface of the exposed outermost Si layer 33 of the SOI substrate 27 is terminated by a hydrogen (H) atom, a silicon (Si) atom and a chlorine (Cl) atom which have dissociated from disilane gas and chlorine gas, which can prevent agglomeration of the Si layer 33. Supply rates of the gases used in this case were 12 sccm for the disilane gas and 0.5 sccm for the chlorine gas, for instance.

In a microscopic view, the above described phenomenon is assumed to be such a phenomenon that the dangling bond 41 of the Si layer 33 is terminated with any one of H, Si or Cl as shown in FIG. 4. Thus, the Si layer 33 of the SOI substrate 27 is stabilized, and the agglomeration of the Si layer can be prevented. Because disilane gas ($Si_2H_6$), for instance, dissociates at about 400° C., it is considered that the dissociated disilane gas ($Si_2H_6$) terminates the dangling bond 41. If there is no atom to terminate Si, it is considered that adjacent Si atoms are combined to each other through remaining hands and cause the agglomeration. It was assumed that the atoms did not cohere even in the Si layer with a thickness of 10 nm or less because the dangling bonds are terminated.

More strictly, the agglomeration of the Si film 33 can be prevented also by introducing only a disilane gas.

However, when only the disilane gas is introduced, the Si film may grow on the Si layer 33 while the temperature is raised, so chlorine gas is intentionally introduced to the Si layer at the same time in the present embodiment so as to prevent the film formation, and prevents the growth of the Si film on the Si layer 33. Accordingly, in a stage of this time zone 51 in a heating and temperature-raising process, the disilane gas ($Si_2H_6$) and the chlorine gas ($Cl_2$) are preferably supplied so as to prevent the agglomeration of the Si layer 33 and also to prevent a Si epitaxial film from being formed.

In the above described case, if the dangling bond of the Si layer 33 is terminated with the above described predetermined atom, the agglomeration of the Si layer can be prevented. Accordingly, as long as a gas decomposes typically in a temperature range of about 400 to 600° C., even a gas except the above described disilane gas, for instance, a germane gas, a monosilane gas and a trisilane gas, can achieve the same action and effect by being introduced at an appropriate timing.

As was described above, the Si epitaxial layer is grown by the steps of: reducing the agglomeration of the Si layer 33 in a prior stage of forming the Si epitaxial film on the outermost Si layer 33 of the SOI substrate 27; heating and temperature-raising the SOI substrate 27 until the temperature reaches a growth temperature (here, about 600° C. which is a growth temperature of silicon when disilane gas is used); gradually reducing an amount of chlorine gas to be introduced among raw gases to be introduced in a raw-gas introduction part 28 after the temperature has been stabilized; finally stopping the supply of the chlorine gas; introducing only the disilane gas on condition of, for instance, 24 sccm; and sequentially growing the Si epitaxial layer.

However, the disilane gas is a raw gas for the growth of the Si film and the chlorine gas is an etching gas for the Si film, as described above, so the Si epitaxial film or the Si layer 33 is etched on the way while the substrate is heated and temperature-raised to a control temperature of 600° C., and the initial film-thickness of the Si layer 33 may not be consequently controlled. However, the film-forming rates of 12 sccm for the disilane gas and 0.5 sccm for the chlorine gas, which have been employed in the present embodiment, are as sufficiently small as 0.1 nm/minute or less at 600° C. or lower, and accordingly does not give influence to the initial film-thickness. As a matter of course, the hydride gas and the halogen-atom-containing etching gas may be introduced step by step. In other words, the hydride gas may be introduced in the vicinity of a comparatively low temperature at which the Si layer coheres and the halogen-atom-containing etching gas may be introduced in the vicinity of the growth temperature of Si. The amounts of the hydride gas and the etching gas to be introduced are preferably adjusted so that the growth of Si and the etching can be balanced.

Due to the above described treatment and action, the dangling bonds on the surface of the exposed outermost Si layer 33 of the SOI substrate 27 are terminated with a hydrogen (H) atom, a silicon (Si) atom and a chlorine (Cl) atom which have dissociated from the disilane gas and chlorine gas, which can prevent agglomeration of the Si layer 33. In other words, because the silicon atom desorbs from the surface of the Si layer 33 at a higher temperature than the hydrogen atom, atoms for stably terminating the dangling bond can be supplied even in the temperature-raising process reaching to a growth temperature by introducing a gas containing a hydride of silicon, and can prevent the agglomeration of the Si layer 33. On the other hand, when the silicon atom is deposited on the surface of the Si layer 33 at a lower temperature than the growth temperature, the growth film results in having inferior characteristics. Accordingly, the operation of simultaneously introducing the etching gas can prevent the agglomeration of the Si layer 33 while reducing the growth of the silicon atom. It is preferable to adjust an amount of each gas to be introduced so as to keep such a balance. In this case, supply rates used in the present embodiment were 12 sccm for the disilane gas and 0.5 sccm for the chlorine gas.

In addition, an epitaxial film to be deposited on the Si layer of the SOI substrate 27 is not limited to a Si epitaxial film. Even when other films than the Si epitaxial film are formed, the agglomeration is prevented by using the hydride gas in general so that the exposed outermost Si layer of the SOI substrate does not cohere. Furthermore, a layer on which the epitaxial film is deposited is not limited to a Si layer, but may be other layers, for instance, a Ge layer. The present invention can be also applied even to the case in which another layer (for instance, Ge layer) than the Si layer is formed on the SOI substrate through the growth of the epitaxial layer. In addition, when the SOI substrate is heat-treated at a agglomeration temperature or higher in the above described embodiment, other different processes may be carried out during heat treatment or after the heat treatment. Furthermore, the present invention can be applied not only to the SOI layer but also to a layered body having a thin Si layer (layer formed of silicon, particularly crystalline silicon) formed as the outermost surface.

Appropriately usable hydride gases include a hydride gas of Si, a hydride gas of Ge, and a gas containing Si and a halogen atom such as a chlorine atom.

However, it is possible to use only a gas containing a halogen atom such as a chlorine atom, in order to prevent the agglomeration of the Si layer of the SOI substrate.

The constitution, the shape, the size and the arrangement relationship described in the above embodiment are merely shown roughly to such an extent that the present invention can be understood and carried out, and furthermore the numerical value and the composition (material) of each constitution are only examples. Accordingly, the present invention is not limited to the described embodiment, but can be changed into various forms unless deviating from a range of the technological scope shown in the claims.

In addition, an FET which is a semiconductor device can be formed on the SOI substrate which has been heated and temperature-raised in the described above method, for instance, by epitaxially growing a p-type Si layer or an n-type Si layer. The FET can be formed by a well-known method, and can be formed, for instance, by the steps of: forming a well region on the Si layer by selectively doping an impurity with an ion implantation technique or a thermal diffusion technique; forming a gate insulation film on the Si layer; and forming a gate electrode on the insulation film. The SOI substrate can also be manufactured by a well-known method, and can be formed with an SIMOX (Separation by IMplantation of OXygen) system or a laminating system.

INDUSTRIAL APPLICABILITY

The present invention is used for reducing the agglomeration of the exposed outermost Si layer of the SOI substrate when the Si layer is heated and temperature-raised.

The invention claimed is:

1. A method for manufacturing a semiconductor device by forming an epitaxial layer as a semiconductor layer on a Si layer of an SOI substrate which has an insulation layer and a Si layer sequentially stacked on a Si substrate, comprising:
   a temperature-raising step of heating and temperature-raising the SOI substrate to an epitaxial growth temperature which is an agglomeration temperature of the Si layer or more, and
   a step of epitaxially growing the semiconductor layer on the temperature-raised Si layer, wherein
   the temperature-raising step includes a step of supplying a hydride gas of Si or Ge and a halogen-atom-containing gas prior to the epitaxial growth to terminate dangling bonds of the Si layer by H atom and Si or Ge dissociated from the hydride gas and to etch Si or Ge formed on the Si layer by the halogen-atom-containing gas so that the Si or Ge is not deposited on the Si layer.

2. The method for manufacturing the semiconductor device according to claim 1, wherein the semiconductor layer is a Si layer or a compound semiconductor layer which comprises Si and another element in the IV family.

3. A method for forming a film on a single-crystal Si layer by growing a film-forming material on the layer from a gas of the film-forming material at a growth temperature which is an agglomeration temperature of the Si layer or more, comprising:
   preparing a substrate having the single-crystal Si layer which is kept at a first temperature lower than the growth temperature, in the inside of a growth chamber;
   introducing a hydride gas of Si or Ge as the gas of the film-forming material and a halogen gas into the growth chamber, before the temperature of the single-crystal Si layer reaches the growth temperature and the film is formed, when raising the temperature of the single-crystal Si layer on the substrate to the growth temperature from the first temperature, to terminate dangling bonds of the Si layer by H atom and Si or Ge dissociated from the hydride gas and to etch Si or Ge formed on the Si layer by the halogen-atom-containing gas so that the Si or Ge is not deposited on the Si layer;

and growing the film-forming material in the gas of the film-forming material on the single-crystal Si layer at the growth temperature, by reducing a content ratio of the halogen atom gas to the gas of the film-forming material in the inside of the film-forming chamber compared to the content ratio at the time before the temperature of the single-crystal Si layer reaches the growth temperature, or by making the content ratio zero, after the temperature of the single-crystal Si layer has reached the growth temperature.

4. The method according to claim 1, wherein the single-crystal Si layer has a thickness of about 10 nm or less.

5. The method according to claim 1, wherein the first temperature is lower than 400° C.

6. The method according to claim 1, wherein the gas of the film-forming material decomposes at the growth temperature or lower.

7. The method according to claim 1, wherein the formed film is an epitaxial layer.

8. The method according to claim 1, wherein the halogen atom gas is chlorine gas or a chlorine-containing gas.

9. The method according to claim 1, wherein the substrate is an SOI substrate.

* * * * *